US011824576B2

(12) United States Patent
Degani et al.

(10) Patent No.: US 11,824,576 B2
(45) Date of Patent: Nov. 21, 2023

(54) APPARATUS, SYSTEM AND METHOD FOR GENERATING AN OUTPUT OSCILLATOR SIGNAL, TRANSCEIVER, MOBILE DEVICE AND BASE STATION

(71) Applicant: Intel Corporation, Santa Clara, CA (US)

(72) Inventors: Ofir Degani, Nes-Ammin (IL); Gil Horovitz, Ekem-Hefer (IL); Evgeny Shumaker, Nesher (IL); Sergey Bershansky, Netanya M (IL); Aryeh Farber, Petah Tikva (IL); Igor Gertman, Petch Tikva M (IL); Run Levinger, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 541 days.

(21) Appl. No.: 17/030,832

(22) Filed: Sep. 24, 2020

(65) Prior Publication Data
US 2022/0094385 A1    Mar. 24, 2022

(51) Int. Cl.
*H04B 1/40* (2015.01)
*H03K 5/24* (2006.01)
*H04W 88/08* (2009.01)

(52) U.S. Cl.
CPC .............. *H04B 1/40* (2013.01); *H03K 5/24* (2013.01); *H04W 88/08* (2013.01)

(58) Field of Classification Search
CPC ...... H04B 1/403; H04B 1/406; H04B 1/3805; H04B 1/005; H04B 1/408; H04B 15/04;
(Continued)

(56) References Cited

U.S. PATENT DOCUMENTS

2010/0323643 A1\* 12/2010 Ridgers ................. H03L 7/0994
                                                                 327/105
2016/0226443 A1     8/2016 Caffee et al.
(Continued)

OTHER PUBLICATIONS

Wang Cheng et al: "A Terahertz Molecular Clock on CMOS Using High-Harmonic-Order Interrogation of Rotational Transition for Medium-/Long-Term Stability Enhancement", IEEE Journal of Solid-State Circuits, IEEE, USA, vol. 56, No. 2, Sep. 16, 2020, pp. 566-580, XP011834488, ISSN: 0018-9200, DOI: 10.1109/JSSC. 2020.3021335 [retrieved on Jan. 27, 2021] \*Section IV.A. Cascaded Two-Stage 231.061-GHz PLL; figure 6.

*Primary Examiner* — Ajibola A Akinyemi
(74) *Attorney, Agent, or Firm* — 2SPL Patent Attorneys PartG mbB; Kieran O'Leary

(57) ABSTRACT

An apparatus for generating an output oscillator signal is provided. The apparatus includes a deviation determining circuitry configured to generate a deviation signal based on a first comparison signal and a second comparison signal. Further, the apparatus includes a first oscillator configured to generate the output oscillator signal based on the deviation signal and a second oscillator signal from a second, resonator-based oscillator. The first comparison signal is based on the second oscillator signal or the output oscillator signal. The second oscillator signal has a frequency of at least 1 GHz. The second comparison signal is based on a third oscillator signal from a third oscillator. The third oscillator signal has a frequency lower than 1 GHz.

34 Claims, 11 Drawing Sheets

(58) Field of Classification Search
CPC . H04B 1/40; H04B 1/54; H04B 10/29; H04B 15/06; H04B 1/006; H04B 1/04; H04B 1/1646
USPC ........................................................ 455/561
See application file for complete search history.

(56) References Cited

U.S. PATENT DOCUMENTS

2019/0341921 A1* 11/2019 Sjöland .................... H03L 7/18
2020/0162084 A1   5/2020 Darabi et al.
2020/0287557 A1   9/2020 Horovitz et al.

* cited by examiner

APPARATUS, SYSTEM AND METHOD FOR GENERATING AN OUTPUT OSCILLATOR SIGNAL, TRANSCEIVER, MOBILE DEVICE AND BASE STATION

FIELD

The present disclosure relates to oscillator signal generation. In particular, examples relate to an apparatus, a system and a method for generating an output oscillator signal, a transceiver, a mobile device and a base station.

BACKGROUND

Oscillator signals comprising high frequencies are usually used as clock signals to control electrical circuits or synchronize processes with high accuracy. Oscillators have often difficulties to generate high frequency signals with long-term frequency stability. Signal instability is usually due to temperature drifts affecting the signal generating oscillator, statistical variances of manufactured oscillators or aging of the oscillator. Reducing these effects often needs expensive packaging and complex mitigations. One approach to counter temperature variations is to apply heaters in proximity of the oscillators. However, these methods are complicated, costly in power and size and are often not sufficient to predict the behavior of the oscillator e.g. with respect to oscillator aging or manufacturing variances.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
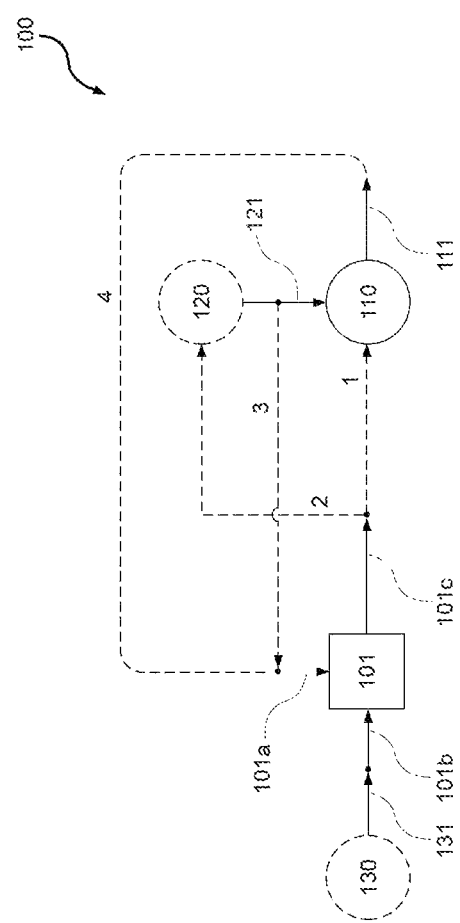
FIG. 1 illustrates a first example of an apparatus for generating, an output oscillator signal.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof but do not exclude the presence or addition of one or more other features, integers, steps, operations, processes, elements, components and/or a group thereof.

FIG. 1 illustrates an apparatus 100 for generating an output oscillator signal 111.

The apparatus 100 comprises a deviation determining circuitry 101 configured to generate a deviation signal 101c based on a first comparison signal 101c and a second comparison signal 101b. Further, the apparatus 100 comprises a first oscillator 110 configured to generate the output oscillator signal 111 based on the deviation signal 101c and a second oscillator signal 121 from a second, resonator-based oscillator 120. The first comparison signal 101a is based on the second oscillator signal 121 or the output oscillator signal 111. The second oscillator signal 121 has a frequency of at least 1 GHz. The second comparison signal 101b is based on a third oscillator signal 131 from a third oscillator 130 and the third oscillator signal 131 has a frequency lower than 1 GHz.

The first oscillator 110 generates the output oscillator signal 111 based on the deviation signal 101c and the second oscillator signal 121. For example, the deviation determining circuitry 101 may generate the deviation signal 101c based on a frequency and/or phase deviation between the first comparison signal 101a and the second comparison signal 101b. For determining the (frequency/phase) deviation, the second comparison signal 101b may serve as a sufficient frequency-stable reference.

By means of the deviation signal 101c, the first oscillator 101 may generate a sufficiently frequency-stable output oscillator signal 111 based on the determined (frequency/phase) deviation. By means of the second oscillator signal 121 having a frequency of at least 1 GHz, the first oscillator 101 may generate the output oscillator signal 111 with high frequency. Hence, the generated output oscillator signal III may be of high frequency and may be sufficiently stable in frequency. Or in other words, the first oscillator 110 e.g. a local oscillator may generate the output oscillator signal 111 with high-frequency and a smaller frequency variation and/or phase variation.

The deviation determining circuitry 101 may detect a phase, time or frequency deviation between the first comparison signal 101a and the second comparison signal 101b representing a sufficiently stable reference. According to the detected deviation, the deviation determining circuitry 101 may generate the deviation signal 101c which can be further used to stabilize the output oscillator signal 111. Referring to the dashed line labeled with "1" in FIG. 1, the first oscillator 110 may directly use the deviation signal 101c (or a modification of the deviation signal 101c) in combination with the second oscillator signal 121 to generate the output oscillator signal 111. According to another example and with reference to the dashed line labeled with "2", the deviation signal 101c (or a modification of the deviation signal 101c) may be used by the second oscillator 120 to generate an e.g. improved second oscillator signal 121, which may have low frequency and/or phase variation over time (e.g. caused by temperature changes and/or aging). In this example, the first oscillator 110 can use the improved second oscillator signal 121 to generate the output oscillator signal 111.

Generally, the deviation determining circuitry 101 may be an arbitrary circuitry such as a comparator detecting a phase, time or frequency deviation between at least two signals to provide an appropriate (e.g. voltage) signal usable for controlling the first oscillator 110 to generate an output oscillator signal 111 comprising a sufficiently stable frequency. For example, the deviation determining circuitry 101 may comprise or may be a time-to-digital converter (TDC) for generating the deviation signal 101c. In the following and for better understanding, examples of apparatus may be described with respect to a frequency deviation. However, it is to be understood that apparatuses may alternatively or additionally be based on a phase or time deviation.

The second comparison signal 101b is based on or is the third oscillator signal 131 from the third oscillator 130. The third oscillator signal 131 may comprise a long-term frequency stability compared to the second oscillator signal 121 used to generate the second oscillator signal 121 and the first oscillator signal 110 used to generate the output oscillator signal 111. The third oscillator signal 131 can be used to determine a relative (frequency/phase) deviation to the second oscillator signal 121 (referring to dashed line "3") or the output oscillator signal 111 (referring to dashed line "4") to generate deviation signal 101c, which is then used to generate the output oscillator signal 111 with higher frequency and/or phase stability.

For example, a (frequency/phase) deviation of the second oscillator signal 121 and consequently of the output oscillator signal 111 may result from a temperature change in proximity of the second oscillator 120, a manufacturing-related variance or an aging of the second oscillator 120. By means of the (high frequency) second oscillator signal 121 and third (frequency stable) oscillator signal 131, the output oscillator signal 111 may be stabilized. By this means, a prior calibration or characterization of a (e.g. temperature) behavior of the second oscillators 120 can be avoided. Generally, a-priori characterization of oscillators at the manufacturing level can be costly and complicated and/or might not be sufficient to identify subsequent frequency-related oscillator behaviors e.g. regarding oscillator aging. As the apparatus 100 may use the second oscillator signal 121 and the third oscillator signal 131 as reference for generating the output oscillator signal 111, subsequent frequency/phase deviations can be compensated sufficiently.

For example, the output oscillator signal 111 has a frequency of at least 10 GHz. The output oscillator signal 111 can be used as a high-frequency clock signal, local oscillator signal, control signal, reference signal with sufficient stability e.g. for triggering or controlling internal or external processes or for synchronizing or managing different processes. The output oscillator signal 111 can be used as local oscillator signal for transmitting or receiving a high frequency signal. The output oscillator signal 111 may have a frequency of at least 10 GHz. at least 15 GHz, at least 20 GHz, at least 30 GHz or at least 60 GHz and/or less than 100 GHz or less than 80 GHz.

For example, the first oscillator 110 is configured to generate the output oscillator signal 111 with a frequency higher than the frequency of the second oscillator signal 121. The first oscillator 110 may be a voltage-controlled oscillator. The first oscillator 110 may be part of a PLL. The second oscillator signal 121 may act as a reference for a radio frequency (RF) or mm-wave (mmW) phase-locked-loop (PLL) generating the output oscillator signal 111.

For example, the second oscillator signal 121 has a frequency of at most 10 GHz (or at most 8 GHz, at most 5 GHz or at most 2 GHz) and/or at least 800 MHz (or at least 1 GHz, at least 2 GHz or at least 5 GHz). The second oscillator signal 121 may comprise a frequency higher than the frequency of the third oscillator signal 131. The second oscillator signal 121 may comprise a lower frequency stability than the third oscillator signal 131.

For example, the second, resonator-based oscillator 120 may comprise or may be a micro-electro-mechanical-system (MEMS) based oscillator. The MEMS based oscillator may be based on or may be a bulk acoustic wave (BAW), surface acoustic wave (SAW) or a film bulk acoustic (FBAR) resonator. The MEMS based oscillator or a part (e.g. a MEMS resonator) of the MEMS based oscillator may be implemented in an integrated circuit (IC) externally from the apparatus 100 such that the second oscillator signal 121 or a signal used to generate the second oscillator signal 121 can be provided to the apparatus 100. According to another example, the MEMS based oscillator or a part (e.g. a MEMS resonator) of the MEMS based oscillator can be integratable in a system-in-package (SiP) or a system on a chip (SoC) comprising the apparatus 100 partly or completely. By this means, the second oscillator signal 121 may be provided internally to the apparatus 100. According to another example, the second oscillator is an arbitrary oscillator being able to generate an oscillator signal with a frequency of at least 1 GHz.

For example, the third oscillator signal 131 has a frequency of at most 200 MHz (or at most 150 MHz, at most 100 MHz or at most 80 MHz) and/or at least 20 MHz (or at least 30 MHz, at least 50 MHz or at least 80 MHz). The third oscillator signal 131 may comprise a long-term frequency stability compared to the second oscillator signal 121.

For example, the third oscillator 130 is a crystal-based oscillator. The crystal-based oscillator may have a lower susceptibility to manufacturing, packaging, thermal or aging effects compared to the second oscillator 120 (e.g. a MEMS based oscillator). The crystal-based oscillator may use a piezoelectric material such as a quartz crystal or polycrystalline ceramics. According to another example, the third oscillator is an arbitrary oscillator being able to serve as a suitable reference for generating the output oscillator signal with sufficient frequency/phase stability. An underlying frequency characteristics of the third oscillator may be frequency accuracy (sufficient equality of nominal and actual values) and long term stability (sufficiently constant over long periods of time).

According, to the example in FIG. 1, the second oscillator 120 and the third oscillator 130 are illustrated with dashed lines indicating that the second and/or the third oscillator can be generated by the apparatus 100 or may be provided to the apparatus. For example, the second oscillator 120 and/or the third oscillator 130 may be part of the apparatus 100 or may be connected to connectable to the apparatus 100. As described above, the dashed lines "1-4" corresponding to the signals refer to different examples of the apparatus 100 which will be further discussed in the following.

Although not explicitly illustrated in FIG. 1, the apparatus 100 may comprise additional or optional circuitry (components) or sensing elements. For example, the apparatus 100 may comprise a control circuitry configured to generate a control signal, a PLL comprising the first oscillator, a digital-loop-filter (DLF), a calibration circuitry configured to generate a temperature signal and/or a temperature sensor. Some exemplary apparatuses showing further details of the proposed technique will be described in the following with reference to FIGS. 2 to 6.

Figure 2:
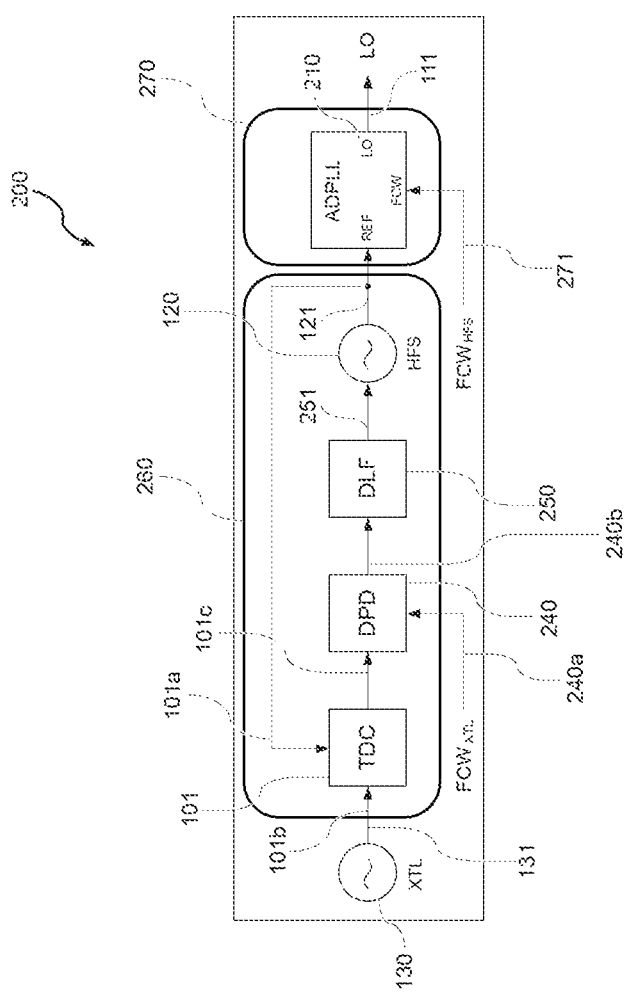
FIG. 2 illustrates a second example of an apparatus for generating an output oscillator signal.

FIG. 2 illustrates a further example of an apparatus 200 comprising the deviation determining circuitry 101 and may comprise an all-digital phase-locked loop (ADPLL) 270 including the first oscillator 210 to generate the output oscillator signal 111. The deviation determining circuitry 101 may comprise a TDC for generating the deviation signal. The second oscillator 120 is labeled with "HFS" indicating a high-frequency-source generating the second oscillator signal 121 and the third oscillator 130 is labeled with "XTL" indicating a crystal-based-oscillator generating the third oscillator signal 131. In the given example, the deviation determining circuitry 101 generates the deviation signal 101a based on the second oscillator signal 121 indicating the first comparison signal 101a and the third oscillator signal 131 indicting the second comparison signal 101b.

The apparatus 200 further comprises control circuitry 240 configured to generate a control signal 240b based on the deviation signal 101c and a first frequency selection signal 240a indicating a first frequency selection. According to the example in FIG. 2, the control circuitry 240 comprises a phase detector circuit e.g. a digital-phase-detector (DPD) of a feedback loop. The control circuitry 240 may generate a (e.g. voltage) signal according to the received deviation signal 101c and the frequency selection, signal 240a. Hence, the control circuitry 240 may translate a detected phase or frequency difference between the two comparison signals 101a, 101b into a control signal 101c. The control signal 101c may comprise an appropriate characteristic (e.g. amplitude) for controlling the second oscillator as specified. Exemplarily, the second oscillator 120 may adapt the frequency/phase of the second oscillator signal 121 based on the control signal 240b to compensate the detected frequency/phase deviation.

As given in FIG. 2, the control signal 240b can be additionally processed by a digital-loop-filter (DLF) 250 or any other filtering circuitry to generate an appropriate, filtered signal 251 for controlling the second oscillator 120.

The frequency selection signal 240a of the control circuitry 240 may comprise a frequency control word (FCW). The $FCW_{XTL}$ may be used to change the control signal 240b to be able select the frequency of the second oscillator signal 121.

According to apparatus 200, the frequency of the second oscillator signal 121 is based on the control signal 240b. The apparatus 200 is configured to use the second oscillator signal 121 as a loop feedback signal of a phase-locked loop circuitry (PLL) 260 comprising the deviation determining circuitry 101. As the second oscillator signal 121 is sent back to the deviation determining circuitry 101, the frequency/phase of the second oscillator signal 121 can be checked repeatedly regarding a consisting frequency/phase deviation with respect to the third oscillator (reference) signal 131. If an undesired frequency/phrase deviation between the second oscillator signal 121 and the third oscillator signal 131 is present or noticeable, the deviation signal 101c can be generated for adjusting or stabilizing the frequency/phase of the second oscillator signal 121. The process within the PLL 260 may continue until a desired (stable) frequency/phase of the second oscillator signal 121 is achieved.

The ADPLL 270 comprises the first oscillator 210. The first oscillator 210 is configured to adjust the frequency of the output oscillator signal 111 based on the adjusted second oscillator signal 121 and a second frequency selection signal 271 indicating a second frequency selection. The second frequency selection signal 271 exemplarily given by $FCW_{HFS}$ may be used to select the frequency of the output oscillator signal 111.

According to another example, the apparatus 200 may comprise another type of phase-locked loop circuitry 270 e.g. an analog PLL (APLL), a digital PLL (DPLL) or any arbitrary PLL configured to generate the output oscillator signal 111 based, on the second oscillator signal 121 and the second frequency selection signal 271.

Generally, the loops may be either frequency tracking loops or phase tracking loops. Regarding the frequency tracking loops, frequencies of two signals may be compared which may result in following the desired phase evolution path at e.g. a constant and a-priori undetermined distance. Regarding the phase tracking loops, a relative phase of two signals may be compared in which the frequency may be a desired byproduct and the phase may be tracked precisely.

FIG. 2 shows an exemplarily implementation of a stabilization loop, where the phase-locked loop 260 is used to stabilize e.g. a GHz reference clock 120 and then use that clock as a reference to the actual ADPLL 270 that can be at a higher frequency and may cover much more bandwidth. In the shown implementation, corrections can be made to an ultrafine capacitor bank (or analog varactor) on the GHz reference 120 and can effectively change its resonance so that the oscillation frequency can be de-skewed and stabilized in temperature. The PLL 260 may be a DPLL to control the GHz reference oscillator 120 by comparing its or a divided down signal (e.g. by using a prescaler) to an arbitrary stable source in the SoC, e.g. the crystal-based oscillator 130. The TDC 101 can be placed close to the GHz reference oscillator 120 or elsewhere. According to the given implementation, the corrections can be applied to the GHz reference oscillator 120 directly. The loop 260 may control and sample the GHz reference 120 e.g. continuously.

FIG. 2 shows an exemplarily implementation of a direct application to the e.g. MEMS-based clock 120. The loop 260 can be considered as a master loop controlling the second oscillator 120. The master loop 260 may be directly based on the second oscillator phase measurement. The loop 270 can be considered as a slave loop generating the output oscillator signal 111 based on the second oscillator signal 121.

More details and aspects are mentioned in connection with the examples described above or below. The example shown in FIG. 2 may comprise one or more optional additional features corresponding to one or more aspects mentioned in connection with the proposed concept or one or more examples described above (e.g. FIG. 1) or below (e.g. FIG. 3-10).

Figure 3:
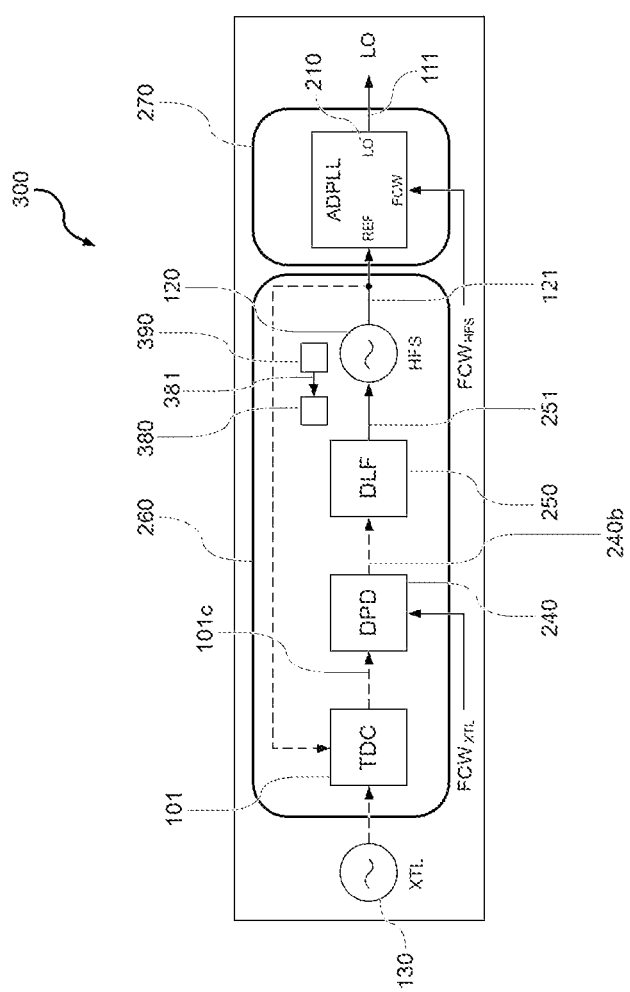
FIG. 3 illustrates a third example of an apparatus for generating an output oscillator signal.

FIG. 3 illustrates a further example of an apparatus 300. The apparatus 300 may be implemented similarly to the apparatus 200 given in FIG. 2 and may further comprise a calibration circuitry 380. The calibration circuitry 380 is configured to receive a temperature signal 381 indicating a temperature in proximity of the second oscillator 120 and to generate a calibration data set based on a set of different temperature signals and a set of values of the control signal corresponding to the different temperature signals. Temperature signals 381 may be generated by a temperature sensor 390 e.g. arranged in proximity of the second oscillator 120. By means of the calibration circuitry 380, the second oscillator signal 121 can be generated without further operation of the PLL 260 comprising the deviation determining circuitry 101. The second oscillator 120 may appropriately generate the second oscillator signal 121 based on the calibration data set. For example, the calibration data set may, have been generated by the calibration circuitry 380 during a previous operation of the PLL 260. While the PLL was operating, the calibration circuitry 380 may have collected deviation signals 101c and/or control signals 240b and corresponding temperature signals 381. By this means, the calibration circuitry 380 can generate the calibration data set, e.g. a list or table, based on the relation between collected control signals 240b indicating the frequency/phase deviation and collected temperature signals 381 indicating temperature-drifts in proximity of the second oscillator 120.

For example, the calibration circuitry is configured to generate a calibration function by fitting a polynomial fit function to the calibration data set. Fitting can be performed e.g. according to a least square algorithm to determine the calibration function. Generally, any suitable criteria for fitting can be used to generate an appropriate calibration function. Another criteria may be to exclude outlier of the calibration data set or to restrict fitting to a particular (e.g. temperature) range.

Hence, the apparatus 300 may operate in at least two operations modes to generate the output oscillator signals 111.

The apparatus 300 is configured to operate in a first operation mode by activating the deviation determining circuitry 101 to generate the deviation signal 101c. In the first operation mode the first oscillator 210 is configured to generate the output oscillator signal 111 based on the deviation signal 101c and the second oscillator signal 121. The first operation mode may represent a standard operation mode in which the deviation determining circuitry 101 is activated. Additionally, further circuitry components of the PLL 260 such as the control circuitry 240 and DLF 250 may be activated to forward a signal based on the deviation signal 101c to the first oscillator 210 of the ADPLL 270. During operation in the first operation mode, the temperature sensor 390 may sense the temperature in proximity of the second oscillator 120 continuously. Additionally, the calibration circuitry 380 may collect temperature signals 381 from the temperature sensor 390 and at least deviation signals 101c or control signals 240b to generate the calibration data set. The first operation mode may be used to generate stable output oscillator signals 111 with respect to temperature drifts and/or other second oscillator related deviations such as aging. The first operation mode may be used priorly to an (e.g. second) operation mode not using the deviation determining circuitry 101 for output oscillator signal generation. Operation in the first operation mode may enable generation of calibration data set by means of the calibration circuitry 380.

The apparatus 300 is configured to operate in a second operation mode by deactivating the deviation determining circuitry 101. In the second operation mode the first oscillator 210 is configured to generate the output oscillator signal 111 based on the calibration data set and the second oscillator signal 121. The second operation mode may represent a power saving operation mode as the deviation determining circuitry 101 and further circuitry components of the PLL 260 such as the control circuitry 240 and DLF 250 can be deactivated. Potential deactivation during the second operation mode is demonstrated in FIG. 3 by dashed lines. During operation in the second operation mode, the temperature sensor 390 may sense the temperature in proximity of the second oscillator 120. The calibration circuitry 380 may collect temperature signals 381 from the temperature sensor 390. Based on registered temperature signals 381 and the given calibration data set, the calibration circuitry 380 may generate a signal for adjusting the (filtered) control signal 251 for generating an improved second oscillator signal 121. The second operation mode may be used to generate a stable output oscillator signals 111 with respect to temperature drifts. The second operation mode may be used subsequent to the first operation mode to enable a provision of the calibration data set.

For example, the apparatus 300 is configured to activate or deactivate the deviation determining circuitry 101 repeatedly to reduce a power consumption of the apparatus 300. The apparatus 300 may activate or deactivate the deviation determining circuitry 101 according to a predetermined sample rate, ad hoc or any criteria suitable to generate a stable output oscillator signal 111 e.g. with less power consumption.

According to another example, the temperature sensor 390 and/or the calibration circuitry 380 may be external components and not part of the apparatus 300. The external components may forward signals e.g. temperatures signals to the apparatus 300 such that the apparatus 300 can generate the output oscillator signal 111 based on the received temperate signals 381.

FIG. 3 shows a direct correction application of the (e.g. MEMS-based) second oscillator 120 according to a sample rate, a periodic interval, or ad-hoc. As illustrated, DLF outputs 251 can be combined with a secondary sensor reading e.g. by means of a thermometer 390 to yield a closed-loop like control functionality.

FIG. 3 demonstrates the operation of the feedback signal in FIG. 2 in a periodic or an ad-hoc manner to compensate for the slow drift of the second (GHz reference) oscillator 120. If it is desired to have a system that functions as a closed loop, the second oscillator signal 121 can be sent back (feedback signal) with e.g. a switching rate twice the Nyquist frequency of the process that one desires to compensate for. For example, a temperature drift can be a very slow process in its nature so a very low sampling frequency may be required, hence the power overhead may be also expected to be very low. For example, sampling may be performed every 5, 10, 20, 50 ms to compensate noticeable temperature gradients within a range of milliseconds.

If the temperature dependence of the second (GHz reference) oscillator 120 can be described as a low degree polynomial, it may be possible to perform an ad-hoc loop operation, and record the DLF output values 251 for several temperatures, and thus obtain e.g. a look-up table that will emulate closed loop operation. Thus, the effects that a closed loop might have on a low jitter reference may be reduced.

More details and aspects are mentioned in connection with the examples described above or below. The example shown in FIG. 3 may comprise one or more optional additional features corresponding to one or more aspects mentioned in connection with the proposed concept or one or more examples described above (e.g. FIG. 1-2) or below (e.g. FIG. 4-10).

Figure 4:
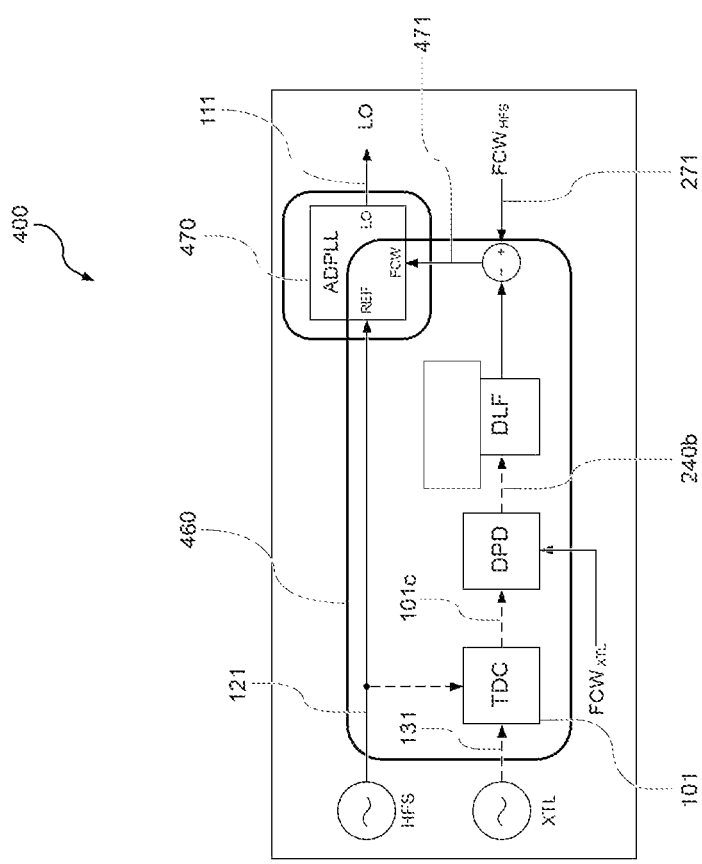
FIG. 4 illustrates a fourth example of an apparatus for generating an output oscillator signal.

FIG. 4 illustrates another example of an apparatus 400 comprising a feedforward (master) loop 460 and an ADPLL 470 (indicating a salve loop). For a better overview of FIG. 4 and a better understanding of the apparatus 400, circuitries and signals without reference signs may be similar to components illustrated in FIG. 2 or 3.

In apparatus 400, the deviation determining circuitry 101 uses the second oscillator signal 121 indicating the first comparison signal and the third oscillator signals 131 indicating the second comparison signal to generate the deviation signal 101c. The control signal 240b is generated based on the deviation signal 101c and the $FCW_{XTL}$. In contrast to the previous examples given in FIG. 2-3, the control signal 240b is forwarded to generate an adapted frequency selection signal 471 of the ADPLL 470 rather than adapting the second oscillator signal 121. The adapted frequency selection signal 471 is based on the control signal 240b (or filtered control signal) and the second frequency selection signal 271. The second frequency selection signal 271 indicates a second frequency selection similarly to the examples discussed above. The first oscillator of the ADPLL 470 is configured to adjust the frequency of the output oscillator signal 111 based on the second oscillator signal 121 and the adapted frequency selection signal 471. By this means, the ADPLL 470 can generate the output oscillator signal 111 at high frequency and with sufficient frequency stability.

In contrast to the examples in FIG. 2-3, the apparatus 400 uses the second oscillator signal 121 as a loop forward signal of the feedforward (master) loop 460 comprising the deviation determining circuitry 101. Similar to the example in FIG. 2, the (master) loop 460 may control and sample the second oscillator continuously. Similar to the example in FIG. 3, the apparatus may operate according to the first (standard) or second (power-saving) operation mode by means of a calibration circuitry, e.g. storing DLF corrections per measured temperature. For example, the apparatus 400 may activate or deactivate the deviation determining circuitry 101 e.g. ad hoc or according to a sample rate. Potential deactivation of circuitry (components) are demonstrated by dashed lines in FIG. 4.

FIG. 4 shows the apparatus 400 with a feed-forward correction of the first oscillator e.g. a local oscillator (clock). Hence, the frequency correction can be applied to the PLL 470, e.g. RF DPLL or ADPLL, that is locked to the second (GHz reference) oscillator 120, and not the second (GHz reference) oscillator 120 itself. In this way, it is possible to avoid a performance degradation accompanied with corrections to the very high quality factor (low phase noise) second (GHz reference) oscillator 120. Performance degradation may be noticeable by a reduced quality factor of the second (GHz reference) oscillator 120.

Generally, one can use the calibration circuitry to be able to perform an efficient and economical factory calibration of the second (GHz reference) oscillator, that may only require a sufficiently stable reference clock, e.g. the third (crystal-based) oscillator, on the test board. While other calibration measurements can be performed, the calibration circuitry can operate in the background in its continuous closed-loop form and can gather the required digital commands either to the DLF, e.g. a GHz ref capacitor, or the (slave) DPLL tuning mechanism, by e.g. storing both the commands and integrated temperature sensor readings. After accumulating a sufficient number of observations, an analytical function approximation can be fitted (e.g. a polynomial function) that describes the behavior of the second (GHz reference) oscillator.

More details and aspects are mentioned in connection with the examples described above or below. The example shown in FIG. 4 may comprise one or more optional additional features corresponding to one or more aspects mentioned in connection with the proposed concept or one or more examples described above (e.g. FIG. 1-3) or below (e.g. FIG. 5-10).

Figure 5:
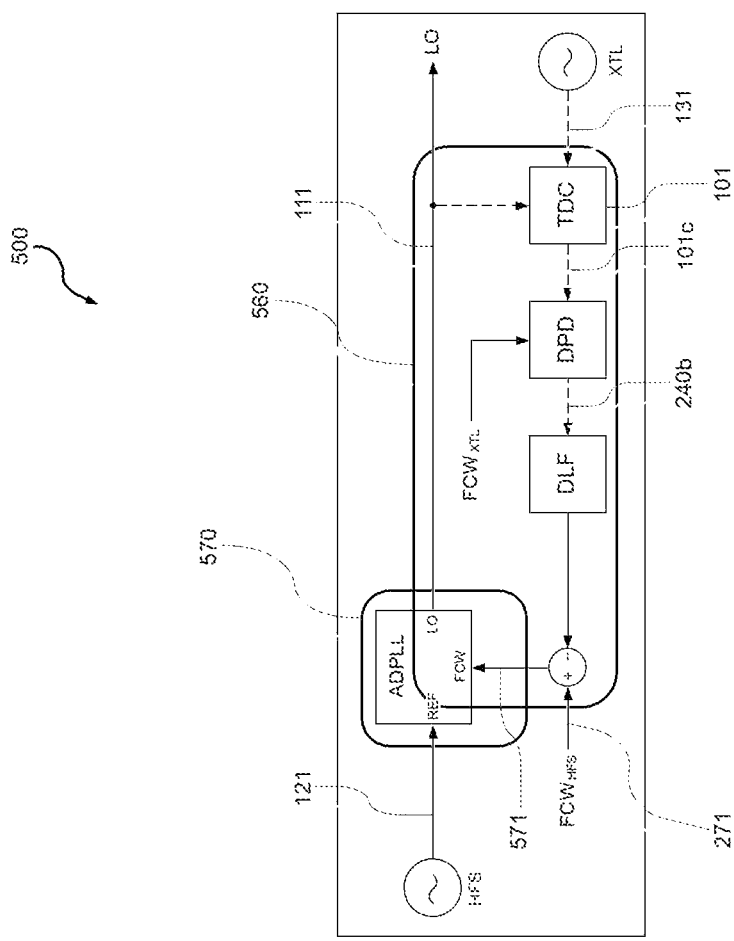
FIG. 5 illustrates a fifth example of an apparatus for generating an output oscillator signal.

FIG. 5 illustrates another example of an apparatus 500 comprising a feedback (master) loop 560 and an ADPLL 570 (indicating the slave loop). For a better overview of FIG. 5 and a better understanding of the apparatus 500, circuitries and signals without reference signs may be similar to components given in FIG. 2-4.

In contrast to the example given in FIG. 3-4, the first comparison signal of the deviation determining circuitry 101 is based on the output oscillator signal 111 rather than the second oscillator signal 121. The second comparison signal is based on the third oscillator signal 131. The control signal 240b is generated based on the deviation signal 101c and the $FCW_{XTL}$. Similar to the previous example given in FIG. 4, the control signal 240b is forwarded to generate an adapted frequency selection signal 571 of the ADPLL 570. The adapted frequency selection signal 571 is based on the control signal 240b (or filtered control signal) and the second frequency selection signal 271. The second frequency selection signal 271 indicates a second frequency selection similarly to the examples discussed above. The first oscillator of the ADPLL 570 is configured to adjust the frequency of the output oscillator signal 111 based on the second oscillator signal 121 and the adapted frequency selection signal 571. By this means, the (slave) ADPLL 570 can generate the output oscillator signal 111 at high frequency and with sufficient frequency stability.

In contrast to the examples given in FIG. 3-4, the apparatus 500 uses the output oscillator signal 111 as a loop feedback signal of the feedback (master) loop 560 comprising the deviation determining circuitry 101. Similar to the examples above, the (master) loop 560 may control and sample the second oscillator 120 e.g. continuously, ad hoc or according to a sample rate by means of the first (standard) or second (power-saving) operation mode.

More details and aspects are mentioned in connection with the examples described, above or below. The example shown in FIG. 5 may comprise one or more optional additional features corresponding to one or more aspects mentioned in connection with the proposed concept or one or more examples described above (e.g. FIG. 1-4) or below (e.g. FIG. 10).

Figure 6:
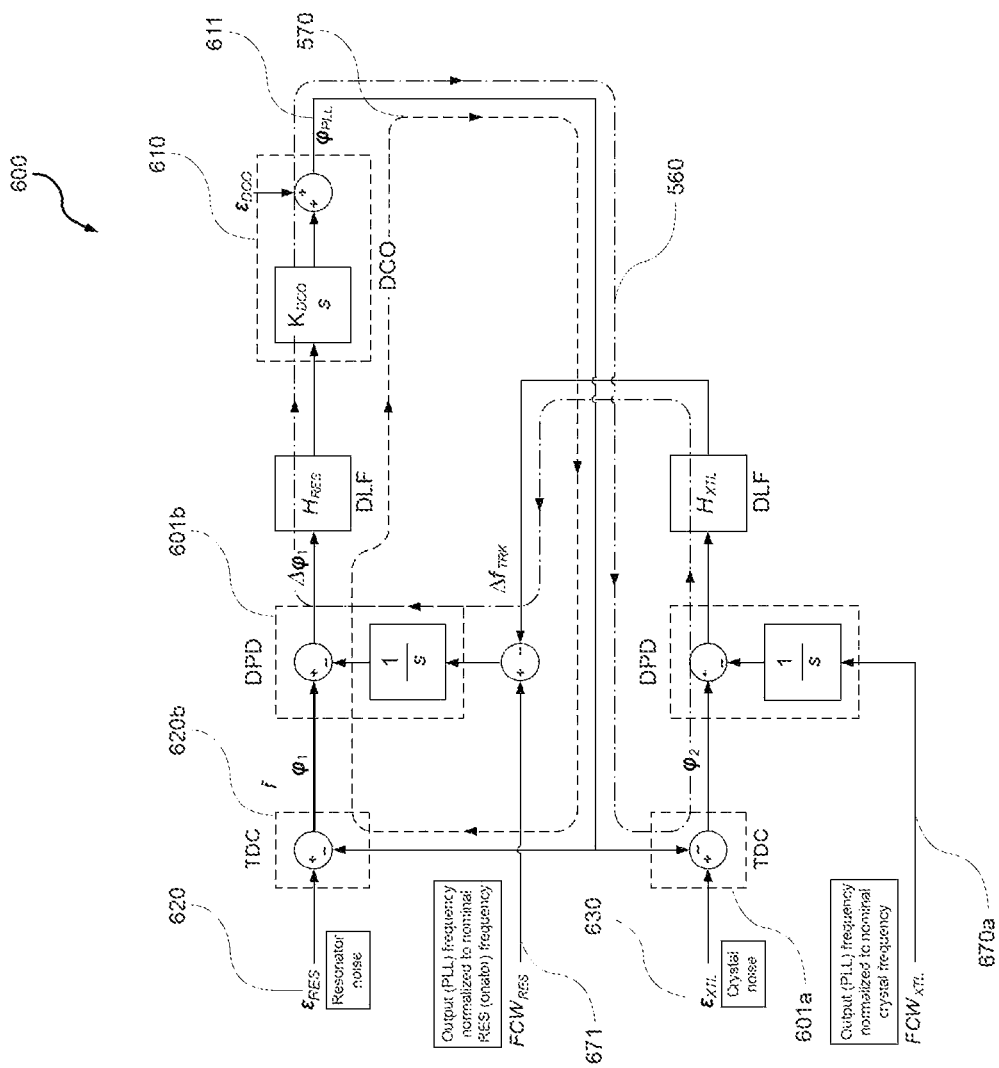
FIG. 6 illustrates a sixth example of an apparatus for generating an output oscillator signal.

FIG. 6 exemplarily outlines FIG. 5 in more detail with respect to the (master) phase-locked loop 560 and the (slave) phase-locked loop 570. The (slave) phase-locked loop 570 has the digitally controlled oscillator (DCO) 610 phase juxtaposed to that of the second (e.g. MEMS-based) oscillator 620, e.g. free running at around the frequency furs. An initial estimate of that frequency ($f_{RES}$ which can be quite crude) can be obtained through measurement with the quartz-crystal oscillator 630 providing the time-base. The frequency control word 671 for the (slave) loop 570 can be given by $$FCW_{RES} = \frac{f_{LO}}{f_{RES}}.$$

The bandwidth of the (slave) loop 570 can be set quite wide, to profit from the high resonator frequency of the second oscillator 620 (and hence small multiplication ratio $$20\log_{10}\left(\frac{f_{LO}}{f_{RES}}\right)$$

and the fine phase noise provided by the second (e.g. high-Q MEMS-based) oscillator 620.

The (master) phase-locked loop 560 may juxtaposes the phase of the same DCO 610 to that of the third (e.g. crystal-based) oscillator 630 with the absolute frequency control word 670a e.g. given by $$FCW_{XTL} = \frac{f_{LO}}{f_{XTL}} ..$$

The phase error can then be filtered and cast into amendment of the $FCW_{RES}$ (denoted $\Delta f_{TRK}$) in FIG. 6.

It can be shown that the phase transfer function of the entire system can be given by $$\varphi_{PLL} = \underbrace{H_{REF}}_{LPF} \cdot \varepsilon_{REF} + \underbrace{H_{DCO}}_{HPF} \cdot \varepsilon_{DCO}$$

with $H_{REF} + H_{DCO} = 1$. "LPF" indicating a low-pass-filter characteristic and "HPF" indicating a high-pass-filter characteristic. The total reference phase error ($\varepsilon_{REF}$) can be given by a similar relation:

$$\varepsilon_{REF} = \underbrace{\frac{H_{XTL}}{1+H_{XTL}}}_{LPF} \cdot \varepsilon_{XTL} + \underbrace{\frac{1}{1+H_{XTL}}}_{HPF} \cdot \varepsilon_{RES}$$

The $H_{XTL}$ denotes the master (open-) loop transfer function and it can be made especially small (equivalent to very small locking bandwidth) so that only the long term average phase deviation of the LO signal 611 can track that of the XTL reference 630. For example, both loops 560, 570 can be divider-less and can employ very simple TDCs. A large dynamic range may be redundant as it may be potentially required in order to characterize the relatively low frequency RES source directly.

in the following, it is shown, how the phase transfer function $\varphi_{PLL}$ and the total reference phase error $\varepsilon_{REF}$ of the entire system can be calculated according to an example:

The output phase of the TDC 601a is:

$\varphi_2 \varepsilon_{XTL} - \varphi_{PLL}$

Rewriting for $\Delta f_{TRK}$ $\Delta f_{TRK} = \varphi_2 H_{XTL} = (\varphi_{DCO} - \varepsilon_{XTL})H_{XTL}$ The output phase of the TDC 601b is:

$\varphi_1 = \varepsilon_{RES} - \varphi_{DCO}$

The output phase error of the DPD 640b is $$\Delta\varphi_1 = \varphi_1 - \left(-\Delta f_{TRK} \cdot \frac{1}{s}\right) = \varepsilon_{RES} - \varphi_{PLL} + (\varepsilon_{XTL} - \varphi_{PLL})H_{XTL} \cdot \frac{1}{s}$$

The output phase of the DCO 610 is
Inserting $\Delta\varphi_1$ gives $$\varphi_{PLL} = \frac{K_{DCO}}{s} \cdot H_{RES} \cdot \Delta\varphi_1 + \varepsilon_{DCO}$$

$$\varphi_{PLL} = \frac{K_{DCO}}{s} \cdot H_{RES} \cdot \left[\varepsilon_{RES} - \varphi_{PLL} + (\varepsilon_{XTL} - \varphi_{PLL})\frac{H_{XTL}}{s}\right] + \varepsilon_{DCO}$$

$$\varphi_{PLL} = \frac{K_{DCO}}{s} \cdot H_{RES} \cdot \left[-\varphi_{PLL}\left(1 + \frac{H_{XTL}}{s}\right) + \varepsilon_{RES} + \varepsilon_{XTL}\frac{H_{XTL}}{s}\right] + \varepsilon_{DCO}$$

$$\varphi_{PLL} = -\frac{K_{DCO}}{s} \cdot H_{RES} \cdot \varphi_{PLL} \cdot \left(1 + \frac{H_{XTL}}{s}\right) +$$

$$\frac{K_{DCO}}{s} \cdot H_{RES} \cdot \varepsilon_{RES} + \frac{K_{DCO}}{s} \cdot H_{RES} \cdot \varepsilon_{XTL} \cdot \frac{H_{XTL}}{s} + \varepsilon_{DCO}$$

$$\varphi_{PLL}\left[1 + \frac{K_{DCO}}{s} \cdot H_{RES} \cdot \left(1 + \frac{H_{XTL}}{s}\right)\right] =$$

$$\frac{K_{DCO}}{s} \cdot H_{REF} \cdot \varepsilon_{RES} + \frac{K_{DCO}}{s} \cdot H_{RES} \cdot \frac{C_{XTL}}{s} \cdot \varepsilon_{XTL} + \varepsilon_{DCO}$$

Stipulating gives $$H_{OL} = \frac{K_{DCO}}{s} \cdot H_{RES} \cdot \left(1 + \frac{H_{XTL}}{s}\right)$$

One can rewrite the output PLL phase as $$\varphi_{PLL} =$$

$$\frac{\frac{K_{DCO}}{s} \cdot H_{RES}}{1 + H_{OL}} \cdot \varepsilon_{RES} + \frac{\frac{K_{DCO}}{s} \cdot H_{RES} \cdot \frac{XH_{XTL}}{s}}{1 + H_{OL}} \cdot \varepsilon_{XTL} + \frac{1}{1 + H_{OL}} \cdot \varepsilon_{DCO}$$

At this stage, it's worthwhile noting that $$\frac{K_{DCO}}{s} \cdot H_{RES} = \frac{H_{OL}}{1 + \frac{H_{XTL}}{s}}$$

And substituting that into the PLL phase formulae produces $$\varphi_{PLL} =$$

$$\frac{H_{OL}}{1 + H_{OL}} \cdot \frac{1}{1 + H_{XTL}} \cdot \varepsilon_{RES} + \frac{H_{OL}}{1 + H_{OL}} \cdot \frac{H_{XTL}}{1 + H_{XTL}} \cdot \varepsilon_{XTL} + \frac{1}{1 + H_{OL}} \cdot \varepsilon_{DCO}$$

$$\varphi_{PLL} = \frac{H_{OL}}{1 + H_{OL}} \cdot \left[\frac{1}{1 + H_{XTL}} \cdot \varepsilon_{RES} + \frac{H_{XTL}}{1 + H_{XTL}} \cdot \varepsilon_{XTL}\right] + \frac{1}{1 + H_{OL}} \cdot \varepsilon_{DCO}$$

Now, this last, result has a nested classical PLL formulation to it $$\varphi_{PLL} = \underbrace{\frac{H_{OL}}{1 + H_{OL}}}_{H_{REF}} \varepsilon_{REF} + \underbrace{\frac{1}{1 + H_{OL}}}_{H_{DCO}} \varepsilon_{DCO}$$

where $\varepsilon_{REF}$ by itself adheres to the same law of $$\varepsilon_{REF} = \frac{1}{1+H_{XTL}} \cdot \varepsilon_{RES} + \frac{H_{XTL}}{1+H_{XTL}} \cdot \varepsilon_{XTL}$$

which means that the total reference noise may be a low-pass filtered quartz-crystal oscillator (XTL) noise and a high-pass (complementary to the above) MEMS oscillator (RES) noise.

More details and aspects are mentioned in connection with the embodiments described above or below. The example shown in FIG. 6 may comprise one or more optional additional features corresponding to one or more aspects mentioned in connection with the proposed concept or one or more examples described above (e.g. FIG. 1-5) or below (e.g. FIG. 7-10).

Generally, the apparatus may comprise the second, resonator-based oscillator configured to generate the second oscillator signal. For example, the first oscillator and at least a part of the second resonator-based oscillator are implemented on the same die. Implementation on the same die may be beneficial e.g. to reduce a size of the apparatus. According to another example, the second oscillator may be configured externally from the apparatus. The second oscillator signal may be forwarded to the apparatus appropriately such that the output oscillator signal can be generated. An external configuration may be preferred e.g. to save costs, to simplify a production or manufacturing of the apparatus or as a second oscillator is already provided in a system.

Generally, at least one of the (master) phase-locked-loop, (slave) phase-locked loop, calibration circuitry and temperature sensor or a part of them can be a component of the apparatus or can be configured externally from the apparatus. If circuitry (components) or elements are configured externally, the signals of the corresponding elements can be forwarded appropriately to the apparatus such that the output oscillator signal can be generated.

Figure 7:
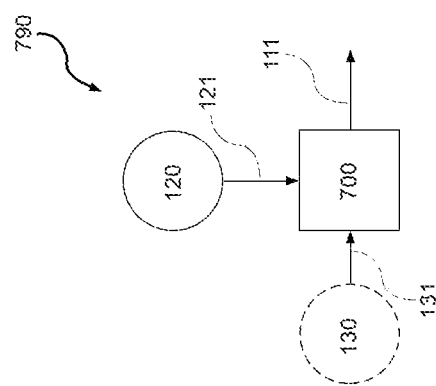
FIG. 7 illustrates an example of a system for generating an output oscillator signal.

FIG. 7 illustrates an example of a system 790 for, generating an output oscillator signal 111. The system 700 comprises an apparatus 700 e.g. according to one of the previous examples and the second, resonator-based oscillator 120 configured to generate the second oscillator signal 121. As indicated by the dashed lines, the system 700 may optionally comprise the third oscillator 130 configured to generate the third oscillator signal 131 forwarded to the apparatus 700.

Figure 8:
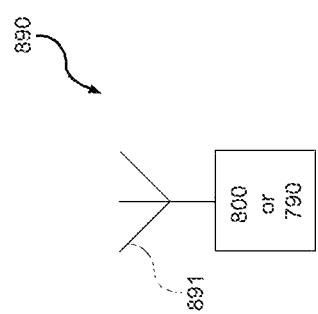
FIG. 8 illustrates an example of a transceiver.

FIG. 8 illustrates an example of a transceiver 890 comprising an apparatus 800 according to one of the previous examples or the system 790 e.g. according to FIG. 7. The transceiver 890 is configured to transmit or receive a high-frequency signal based on the output oscillator signal 111. The transceiver 890 may comprise at least one antenna element 891 coupled to the transceiver 890 for radiating the high-frequency signal to the environment. The antenna element 891 or another antenna element (not illustrated) may be further configured to receive a high-frequency signal. The transceiver 890 may be coupled to the antenna element 891 via one or more intermediate elements such as a filter, an up-converter (mixer) or a power amplifier (PA).

Figure 9:
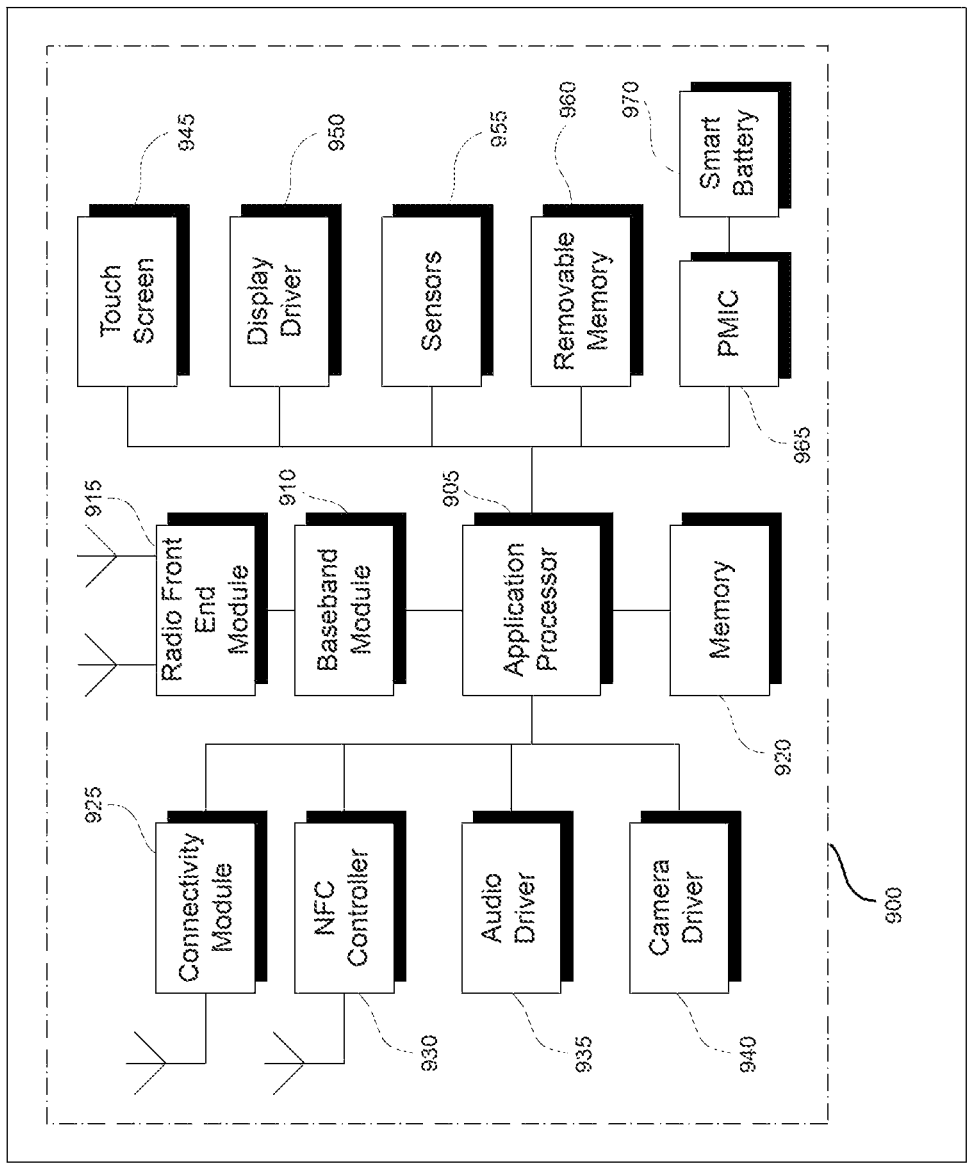
FIG. 9 illustrates an example of a mobile device.

FIG. 9 illustrates an example of a mobile device 900 comprising an apparatus according to one of the previous examples and a transmitter configured to transmit a high-frequency signal based on the output oscillator signal. For example, the mobile device 900 is a mobile phone, smart-phone, tablet-computer or a laptop.

The mobile device 900 may further include an application processor 905, baseband processor 910 (also referred to as a baseband module), radio front end module (RFEM) 915, memory 920, connectivity module 925, near field communication (NFC) controller 930, audio driver 935, camera driver 940, touch screen 945, display driver 950, sensors 955, removable memory 960, power management integrated circuit (PMIC) 965 and smart battery 970.

In some aspects, application processor 905 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 910 may be implemented, for example, as a solder-down substrate including one or more integrated circuits, a single packaged integrated circuit soldered to a main circuit board, and/or a multi-chip module containing two or more integrated circuits.

To this end, a mobile device with improved high-frequency signal may be provided by means of improved output oscillator signal generation.

Figure 10:
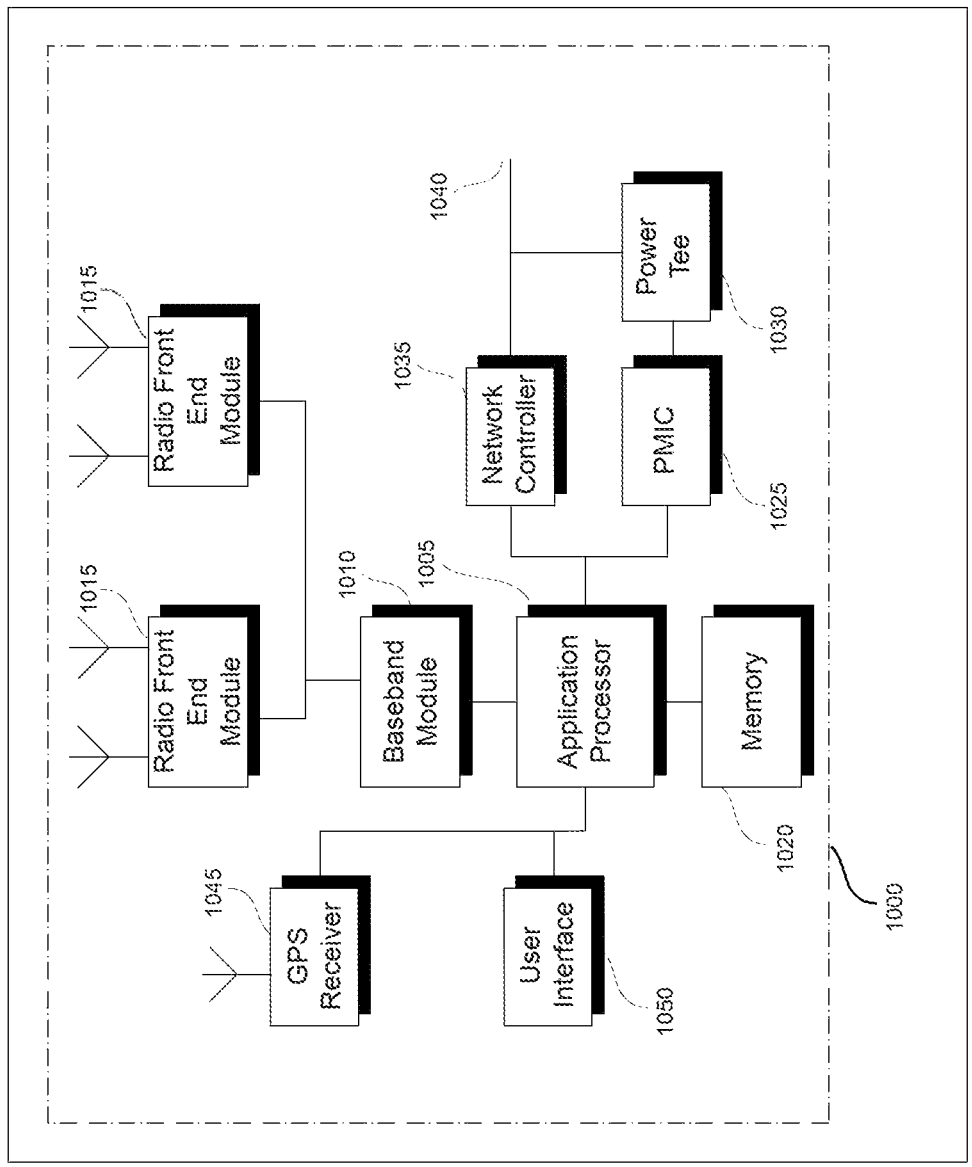
FIG. 10 illustrates an example of a base station.

FIG. 10 illustrates an example of a base station or infrastructure equipment radio head 1000. The base station 1000 comprises the apparatus according to one of the previous examples and a transmitter configured to transmit a high-frequency signal based on the output oscillator signal.

The base station radio head 1000 may further include one or more application processor 1005, baseband modules 1010, one or more radio front end modules 1015, memory 1020, power management circuitry 1025, power tee circuitry 1030, network controller 1035, network interface connector 1040, satellite navigation receiver module 1045, and user interface 1050.

In some aspects, application processor 1005 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1010 may be implemented, for example, as a solder-down substrate including one or more integrated circuits, a single packaged integrated circuit soldered to a main circuit board or a multi-chip module containing two or more integrated circuits.

In some aspects, memory 1020 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 1020 may be implemented as one or more of solder down packaged integrated circuits, socketed memory modules and plug-in memory cards. In some aspects, power management integrated circuitry 1025 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1030 may provide for electrical power drawn from a network cable to provide both power supply and data connectivity to the base station radio head 1000 using a single cable.

In some aspects, network controller 1035 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1045 may include circuitry to receive and decode signals transmitted by one or more navigation satellite constellations such as the global positioning system (GPS). Globalnaya Navigatsionnaya Sputnikovaya Sistema (GLONASS), Galileo and/or BeiDou. The receiver 1045 may provide data to application processor 1005 which may include one or more of position data or time data. Application processor 1005 may use time data to synchronize operations with other radio base stations. In some aspects, user interface 1050 may include one or more of physical or virtual buttons, such as a reset button, one or more indicators such as light emitting diodes (LEDs) and a display screen.

To this end, a base station with improved high-frequency signal may be provided by means of improved output oscillator signal generation.

Figure 11:
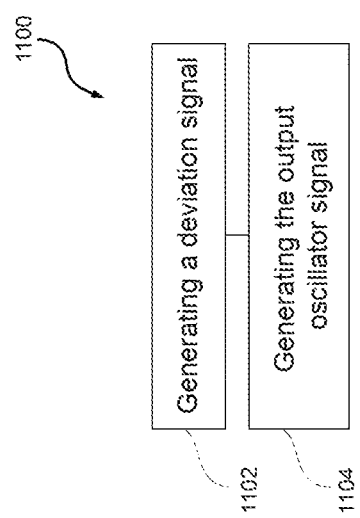
FIG. 11 illustrates a flowchart of an example of a method for generating an output oscillator signal.

FIG. 11 illustrates a flow chart of an example of a method 1100 for generating an output oscillator signal. The method 1100 generates a deviation signal 1102 by means of a deviation determining circuitry based on a first comparison signal and a second comparison signal. Further, the method generates the output oscillator signal 1104 by means of a first oscillator based on the deviation signal and a second oscillator signal from a second, resonator-based oscillator. The first comparison signal is based on the second oscillator signal or the output oscillator signal. The second oscillator signal has a frequency of at least 1 GHz. The second comparison signal is based on a third oscillator signal from a third oscillator and the third oscillator signal has a frequency lower than 1 GHz. For example, the output oscillator signal has a frequency of at least 10 GHz.

The method may allow generation of an improved output oscillator signal e.g. comprising high frequency and sufficient frequency stability. The method may allow to generate the output oscillator signal at lower costs, with less a-priori characterization of oscillators or less complex efforts for manufacturing a mean for generating an output oscillator signal.

More details and aspects are mentioned in connection with the embodiments described above or below. The method may comprise one or more optional additional features corresponding to one or more aspects mentioned in connection with the proposed concept or one or more examples described above or below.

Some other examples may relate to a method and/or an apparatus for stabilization of a GHz resonator-based reference clock. GHz resonators (e.g. the likes of MEMS) may hold the potential to fabricate a low jitter high frequency clock with very low start-up time, to act as a reference for an RF/mmW PLL. These resonators may tend to be unstable in temperature, have a very large statistical skew and suffer from aging effects in comparison to their lower frequency counterparts e.g. the quartz crystal resonators. Reducing these effects may often require expensive packaging and complex system mitigations.

According to other examples, undesired effects may be reduced by using look up tables to predict the resonator behavior. This approach can be non-feasible when looking at most GHz resonators since this behavior can be very stress and package related, and there may be no guarantee that the table will depict the actual behavior of the GHz resonator.

According to other examples, heaters can be applied in proximity to the resonators to counter temperature variations. This approach may be very costly both in power and size.

According to other examples, open loop compensations based on factory measurements at several temperatures can be applied to construct a prediction curve. This approach may require a factory calibration at several temperatures which can be very costly and complicated.

The apparatus as exemplarily described above may stabilize (e.g. continuously, in periodic intervals or ad hoc) the GHz clock (or any type of less stable timing device) to a second (e.g. cheaper) clock e.g. already found in the system on chip (SoC) or elsewhere that e.g. does not hold such qualities as low jitter and may operate at significantly lower frequency but may be less prone to drift (stable), and can be by itself calibrated using more conventional methods that could not apply for GHz resonators (or any other form of technology facing similar issues).

The apparatus may enable said synchronization by implementing a phase locked loop that e.g. compares both clocks and adjust the frequency/phase of both or if needed just one of the clocks. The apparatus can operate continuously or can sample e.g. in order to reduce power. When combined with further system reading (such as temperature signals from e.g. an integrated temperature sensor) it may be possible to construct a table that can hold the corrections needed per reading thus possibly allowing for open loop operation that may have similar attributes to a closed loop operation since it can be obtained from a closed loop measurement.

The apparatus can operate seamlessly e.g. without stopping a systems operation. Further, the apparatus or corresponding components of the apparatus e.g. the (internal or external) GHz oscillator may require very little factory calibration and can reach ppm-level accuracies. The apparatus can utilize non-localized existing stable sources and thus can reduce the cost e.g. since stability requirements from the GHz resonator may reduce significantly.

According to an example, the apparatus may call for a connection of the GHz oscillator to a phase frequency detector and a connection of that to a second existing source. For example, a SoC clock connects to a Wi-Fi macro.

The apparatus may be identified by e.g. microscope inspection of the chip comprising the apparatus or a part of the apparatus. The microscope inspection may reveal the feedback or feedforward signal used to evaluate the GHz resonator state relative to that of the stable reference.

Some examples relate to a master-slave PLL for long term frequency accuracy improvement. The continuing evolution of wireless communication standards may pose increasingly stringent demands on the spectral purity on the system's local oscillators. To adhere to these requirements, novel frequency standards are being developed, to supplement (and perspectival replace) e.g. the traditional quartz-crystal based frequency standards. Among these are the MEMS (most notorious of which are the BAW/SAW/FBAR) resonator-based oscillators, that besides being integratable in SiP alongside Si SOC, may feature excellent mid-term frequency stability. Their absolute frequency accuracy as well as long-term frequency stability may still fall significantly behind that of quartz-crystal based sources. The apparatus as exemplarily described above may present a concept to efficiently combine the best of both worlds.

All currently available mitigations may fall under the pretense of open loop correction. For example, an a-priori characterization of either the resonator at hand or some average representative of the kind is used to amend the frequency inaccuracy according to an a-posteriori estimated value of the characterization variable (e.g. the temperature).

However, there may be a lack of direct a-posteriori measurement of the variable of interest e.g. frequency. Different environmental changes as well as aging may have varying impact on that variable. This behavior could not be sufficiently captured in time of a-priori characterization. For example, the sample, at hand may, be weakly represented by an ensemble average in case of such characterization.

The concept of the apparatus or method may use two-phase locked loops, where the inner loop, e.g. denoted as slave loop, may be continuously driven by e.g. the MEMS-resonator source and an outer master loop may be driven e.g. continuously, periodically or in an ad-hoc fashion by a e.g. quartz crystal-based source. Both loops may juxtapose the phase of the local oscillator to the phase of their respective sources. For example and with reference to FIG. 5-6, in the slave loop the resulting correction may be applied to the RF oscillator directly whereas the correction stemming from the master loop may be applied to the frequency control word of the slave loop. Potentially being significantly stronger or faster, the slave loop may dictate the in-band phase characteristics of the resulting LO signal whereas only the long-term frequency accuracy may be dictated by the master loop.

The concept may enable the use of very economical (e.g. in terms of cost and/or supplied power) quartz crystal resonators as only the very long-term accuracy may be dictated by it.

The concept may enable a closed loop tracking and no need for an a-priori characterization of the MEMS resonator. For example, it may be redundant to make assumptions on resonator production variances, temperature correlations, dynamics and aging effects.

For example and with respect to FIG. 5-6, the master loop may feed-forward the frequency control word correction to the slave loop thereby potentially allowing the MEMS resonator a truly open-loop operation, minimizing tuning related errors and potentially allowing to realize its full potential e.g. in terms of mid-term frequency stability.

A distinct structural feature of the apparatus could be the connection of a single RF DCO to two TDC circuits, with each being driven by a different reference source. For example, the presence of MEMS based source in the system alongside the quartz crystal can also be readily established.

For example, the apparatus or concepts of the apparatus may be achieved or identified by replacing an on-board crystal source with a RF generator output. This may enable continuous control of the output frequency. This may constitute the presence of the master loop.

As described above, corrections can be applied directly to the e.g. MEMS based clock or can be passed on as FCW to an RF clock synthesizer. Corrections may be interfered by e.g. creating a secondary phase/frequency locked loop by e.g. juxtaposing the phase of either the MEMS-based clock (HFS) or the output of the RF synthesizer (LO) to a more accurate and stable (but lower jitter quality and frequency reference e.g. present in the system).

The examples described herein may be summarized as follows:

Example 1 is an apparatus for generating an output oscillator signal, comprising deviation determining circuitry configured to generate a deviation signal based on a first comparison signal and a second comparison signal. Further, the apparatus comprises a first oscillator configured to generate the output oscillator signal based on the deviation signal and a second oscillator signal from a second, resonator-based oscillator, wherein the first comparison signal is based on the second oscillator signal or the output oscillator signal, wherein the second oscillator signal has a frequency of at least 1 GHz, wherein the second comparison signal is based on a third oscillator signal from a third oscillator, wherein the third oscillator signal has a frequency lower than 1 GHz.

Example 2 is the apparatus of example 1, wherein the output oscillator signal has a frequency of at least 10 GHz.

Example 3 is the apparatus of example 1 or example 2, wherein the second oscillator signal has a frequency of at most 10 GHz.

Example 4 is the apparatus of any of the examples 1 to 3, wherein the first oscillator is configured to generate the output oscillator signal with a frequency higher than the frequency of the second oscillator signal.

Example 5 is the apparatus of any of the examples 1 to 4, wherein the second, resonator-based oscillator is a micro-electro-mechanical-system-based oscillator.

Example 6 is the apparatus of any of the examples 1 to 5, wherein the third oscillator signal has a frequency of at most 200 MHz.

Example 7 is the apparatus of any of the examples 1 to 6, wherein the third oscillator is a crystal-based oscillator.

Example 8 is the apparatus of any of the examples 1 to 7, further comprising control circuitry configured to generate a control signal based on the deviation signal and a first frequency selection signal indicating a first frequency selection.

Example 9 is the apparatus of the example 8, wherein the control circuitry comprises a phase detector circuit of a feedback loop or a feedforward loop.

Example 10 is the apparatus of the example 8 or example 9, wherein the frequency of the second oscillator signal is based on the control signal, wherein the apparatus is configured to use the second oscillator signal as a loop feedback signal of a phase-locked loop circuitry comprising the deviation determining circuitry, wherein the first comparison signal is based on the second oscillator signal.

Example 11 is the apparatus of any of the examples 8 to 10, wherein the first oscillator is configured to adjust the frequency of the output oscillator signal based on the second oscillator signal and a second frequency selection signal indicating a second frequency selection, wherein the second oscillator signal is based on the control signal, wherein the first comparison signal is based on the second oscillator signal.

Example 12 is the apparatus of any of the examples 8 to 11, further comprising phase-locked loop circuitry comprising the first oscillator configured to generate the output oscillator signal based on the second oscillator signal and a second frequency selection signal indicating a second frequency selection, wherein the second oscillator signal is based on the control signal.

Example 13 is the apparatus of the example 8 or example 9, wherein the first oscillator is configured to adjust the frequency of the output oscillator signal based on the second oscillator signal and an adapted frequency selection signal, wherein the adapted frequency selection signal is based on the control signal and a second frequency selection signal indicating a second frequency selection, wherein the first comparison signal is based on the second oscillator signal.

Example 14 is the apparatus of any of the examples 8, 9 or 13, wherein the apparatus is configured to use the second oscillator signal as a loop forward signal of a feedforward loop comprising the deviation determining circuitry, wherein the first comparison signal is based on the second oscillator signal.

Example 15 is the apparatus of any of the examples 8, 9, 13 or 14, further comprising phase-locked loop circuitry comprising the first oscillator configured to generate the output oscillator signal based on the second oscillator signal and an adapted frequency selection signal, wherein the adapted frequency selection signal is based on the control signal and a second frequency selection signal indicating a second frequency selection.

Example 16 is the apparatus of the example 8 or example 9, wherein the first oscillator is configured to adjust the frequency of the output oscillator signal based on the second oscillator signal and an adapted frequency selection signal, wherein the adapted frequency selection signal is based on the control signal and a second frequency selection signal indicating a second frequency selection, wherein the first comparison signal is based on the output oscillator signal.

Example 17 is the apparatus of any of the examples 8, 9 or 16, wherein the apparatus is configured to use the output oscillator signal as a loop feedback signal of a feedback loop comprising the deviation determining circuitry, wherein the first comparison signal is based on the output oscillator signal.

Example 18 is the apparatus of any of the examples 8, 9, 16 or 17, further comprising phase-locked loop circuitry comprising the first oscillator configured to generate the output oscillator signal based on the second oscillator signal and an adapted frequency selection signal, wherein the adapted frequency selection signal is based on the control signal and a second frequency selection signal indicating a second frequency selection.

Example 19 is the apparatus of any of the examples 8 to 18, further comprising calibration circuitry configured to receive a temperature signal indicating a temperature in proximity of the second oscillator and to generate a calibration data set based on a set of different temperature signals and a set of values of the control signal corresponding to the different temperature signals.

Example 20 is the apparatus of the example 19, wherein the calibration circuitry is configured to generate a calibration function by fitting a polynomial fit function to the calibration data set.

Example 21 is the apparatus, of any of the examples 1 to 20, wherein the apparatus is configured to operate in a first operation mode by activating the deviation determining circuitry to generate the deviation signal, wherein the first oscillator is configured to generate the output oscillator signal based on the deviation signal and the second oscillator signal.

Example 22 is the apparatus of any of the examples 19 to 21, wherein the apparatus is configured to operate in a second operation mode by deactivating the deviation determining circuitry, wherein the first oscillator is configured to generate the output oscillator signal based on the calibration data set and the second oscillator signal.

Example 23 is the apparatus of any of the examples 1 to 22, wherein the apparatus is configured to activate or deactivate the deviation determining circuitry repeatedly to reduce a power consumption of the apparatus.

Example 24 is the apparatus of any of the examples 19 to 23, further comprising a temperature sensor configured to detect the temperature in proximity of the second oscillator and to generate the temperature signal.

Example 25 is the apparatus of any of the examples 1 to 24, wherein the deviation determining circuitry comprises a time-to-digital converter.

Example 26 is the apparatus of any of the examples 1 to 25, further comprising the second, resonator-based oscillator configured to generate the second oscillator signal, wherein the first oscillator and at least a part of the second resonator-based oscillator are implemented on the same die.

Example 27 is a system for generating an output oscillator signal, comprising the apparatus of any of the examples 1 to 25 and the second, resonator-based oscillator configured to generate the second oscillator signal.

Example 28 is the system of example 27, further comprising the third oscillator configured, to generate the third oscillator signal.

Example 29 is a transceiver, comprising the apparatus of any of examples 1 to 26 or the system of the example 27 or the example 28, wherein the transceiver is configured to transmit or receive a high-frequency signal based on the output oscillator signal.

Example 30 is a mobile device, comprising the apparatus of any of the examples 1 to 26 and a transmitter configured to transmit a high-frequency signal based on the output oscillator signal.

Example 31 is a base station, comprising the apparatus of any of the examples 1 to 26 and a transmitter configured to transmit a high-frequency signal based on the output oscillator signal.

Example 32 is, a method for generating an output oscillator signal, comprising: generating a deviation signal by means of a deviation determining circuitry based on a first comparison signal and a second comparison signal and generating the output oscillator signal by means of a first oscillator based on the deviation signal and a second oscillator signal from a second, resonator-based oscillator, wherein the first comparison signal is based on the second oscillator signal or the output oscillator signal, wherein the second oscillator signal has a frequency of at least 1 GHz, wherein the second comparison signal is based on a third oscillator signal from a third oscillator, wherein the third oscillator signal has a frequency lower than 1 GHz.

Example 33 is the method of example 32 wherein the output oscillator signal has a frequency of at least 10 GHz.

Example 34 is a machine-readable storage medium including program code, when executed, to cause a machine to perform the method of example 32 or example 33.

Examples of the proposed technique may enable to generate an improved output oscillator signal.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include, a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An apparatus for generating an output oscillator signal, comprising:
   deviation determining circuitry configured to generate a deviation signal based on a first comparison signal and a second comparison signal; and
   a first oscillator configured to generate the output oscillator signal based on the deviation signal and a second oscillator signal from a second, resonator-based oscillator,
   wherein the first comparison signal is based on the second oscillator signal or the output oscillator signal, wherein the second oscillator signal has a frequency of at least 1 GHz, wherein the second comparison signal is based on a third oscillator signal from a third oscillator, wherein the third oscillator signal has a frequency lower than 1 GHz.

2. The apparatus according to claim 1, wherein the output oscillator signal has a frequency of at least 10 GHz.

3. The apparatus according to claim 1, wherein the second oscillator signal has a frequency of at most 10 GHz.

4. The apparatus according to claim 1, wherein the first oscillator is configured to generate the output oscillator signal with a frequency higher than the frequency of the second oscillator signal.

5. The apparatus according to claim 1, wherein the second, resonator-based oscillator is a micro-electro-mechanical-system-based oscillator.

6. The apparatus according to claim 1, wherein the third oscillator signal has a frequency of at most 200 MHz.

7. The apparatus according to claim 1, wherein the third oscillator is a crystal-based oscillator.

8. The apparatus according to claim 1, further comprising control circuitry configured to generate a control signal based on the deviation signal and a first frequency selection signal indicating a first frequency selection.

9. The apparatus according to claim 8, wherein the control circuitry comprises a phase detector circuit of a feedback loop or a feedforward loop.

10. The apparatus according to claim 8, wherein the frequency of the second oscillator signal is based on the control signal, wherein
    the apparatus is configured to use the second oscillator signal as a loop feedback signal of a phase-locked loop circuitry comprising the deviation determining circuitry,
    wherein the first comparison signal is based on the second oscillator signal.

11. The apparatus according to claim 8, wherein the first oscillator is configured to adjust the frequency of the output oscillator signal based on the second oscillator signal and a second frequency selection signal indicating a second frequency selection, wherein the second oscillator signal is based on the control signal, wherein the first comparison signal is based on the second oscillator signal.

12. The apparatus according to claim 8, further comprising
    phase-locked loop circuitry comprising the first oscillator configured to generate the output oscillator signal based on the second oscillator signal and a second frequency selection signal indicating a second frequency selection, wherein the second oscillator signal is based on the control signal.

13. The apparatus according to claim 8, wherein the first oscillator is configured to adjust the frequency of the output oscillator signal based on the second oscillator signal and an adapted frequency selection signal, wherein the adapted frequency selection signal is based on the control signal and a second frequency selection signal indicating a second frequency selection, wherein the first comparison signal is based on the second oscillator signal.

14. The apparatus according to claim 8, wherein the apparatus is configured to use the second oscillator signal as a loop forward signal of a feedforward loop comprising the deviation determining circuitry, wherein the first comparison signal is based on the second oscillator signal.

15. The apparatus according to claim 8, further comprising
    phase-locked loop circuitry comprising the first oscillator configured to generate the output oscillator signal based on the second oscillator signal and an adapted frequency selection signal, wherein the adapted frequency selection signal is based on the control signal and a second frequency selection signal indicating a second frequency selection.

16. The apparatus according to claim 8, wherein the first oscillator is configured to adjust the frequency of the output oscillator signal based on the second oscillator signal and an adapted frequency selection signal, wherein the adapted frequency selection signal is based on the control signal and a second frequency selection signal indicating a second frequency selection, wherein the first comparison signal is based on the output oscillator signal.

17. The apparatus according to claim 8, wherein the apparatus is configured to use the output oscillator signal as a loop feedback signal of a feedback loop comprising the deviation determining circuitry, wherein the first comparison signal is based on the output oscillator signal.

18. The apparatus according to claim 8, further comprising
phase-locked loop circuitry comprising the first oscillator configured to generate the output oscillator signal based on the second oscillator signal and an adapted frequency selection signal, wherein the adapted frequency selection signal is based on the control signal and a second frequency selection signal indicating a second frequency selection.

19. The apparatus according to claim 8, further comprising
calibration circuitry configured to receive a temperature signal indicating a temperature in proximity of the second oscillator and to generate a calibration data set based on a set of different temperature signals and a set of values of the control signal corresponding to the different temperature signals.

20. The apparatus according to claim 19, wherein the calibration circuitry is configured to generate a calibration function by fitting a polynomial fit function to the calibration data set.

21. The apparatus according to claim 19, further comprising
a temperature sensor configured to detect the temperature in proximity of the second oscillator and to generate the temperature signal.

22. The apparatus according to claim 19, wherein the apparatus is configured to operate in a second operation mode by deactivating the deviation determining circuitry, wherein the first oscillator is configured to generate the output oscillator signal based on the calibration data set and the second oscillator signal.

23. The apparatus according to claim 1, wherein the apparatus is configured to operate in a first operation mode by activating the deviation determining circuitry to generate the deviation signal, wherein the first oscillator is configured to generate the output oscillator signal based on the deviation signal and the second oscillator signal.

24. The apparatus according to claim 1, wherein the apparatus is configured to activate or deactivate the deviation determining circuitry repeatedly to reduce a power consumption of the apparatus.

25. The apparatus according to claim 1, wherein the deviation determining circuitry comprises a time-to-digital converter.

26. The apparatus according to claim 1, further comprising
the second, resonator-based oscillator configured to generate the second oscillator signal, wherein the first oscillator and at least a part of the second resonator-based oscillator are implemented on the same die.

27. A system for generating an output oscillator signal, comprising:
the apparatus according to claim 1; and
the second, resonator-based oscillator configured to generate the second oscillator signal.

28. The system according to claim 27, further comprising:
the third oscillator configured to generate the third oscillator signal.

29. A transceiver, comprising:
the apparatus according to claim 1, wherein
the transceiver is configured to transmit or receive a high-frequency signal based on the output oscillator signal.

30. A mobile device, comprising:
the apparatus according to claim 1; and
a transmitter configured to transmit a high-frequency signal based on the output oscillator signal.

31. A base station, comprising:
the apparatus according to claim 1; and
a transmitter configured to transmit a high-frequency signal based on the output oscillator signal.

32. A method for generating an output oscillator signal, comprising:
generating a deviation signal by means of a deviation determining circuitry based on a first comparison signal and a second comparison signal; and
generating the output oscillator signal by means of a first oscillator based on the deviation signal and a second oscillator signal from a second, resonator-based oscillator,
wherein the first comparison signal is based on the second oscillator signal or the output oscillator signal, wherein the second oscillator signal has a frequency of at least 1 GHz, wherein the second comparison signal is based on a third oscillator signal from a third oscillator, wherein the third oscillator signal has a frequency lower than 1 GHz.

33. The method according to claim 32, wherein the output oscillator signal has a frequency of at least 10 GHz.

34. A non-transitory, machine-readable storage medium including program code, when executed, to cause a machine to perform the method according to claim 32.

* * * * *